United States Patent [19]

Schenk

[11] Patent Number: 5,009,311

[45] Date of Patent: Apr. 23, 1991

[54] REMOVABLE RIGID SUPPORT STRUCTURE FOR CIRCUIT CARDS

[76] Inventor: Robert J. Schenk, 28 Valley View Ter., Wayne, N.J. 07470

[21] Appl. No.: 536,324

[22] Filed: Jun. 11, 1990

[51] Int. Cl.⁵ .................................................. B65D 81/06
[52] U.S. Cl. ....................................... 206/332; 53/449; 206/334
[58] Field of Search ............... 206/328, 331, 334, 523, 206/524, 332; 53/449, 473

[56] References Cited

U.S. PATENT DOCUMENTS

| | | | |
|---|---|---|---|
| 3,346,221 | 10/1967 | Farmer | 206/334 |
| 3,415,364 | 12/1968 | Schneider | 206/524 |
| 3,485,347 | 12/1969 | McGill et al. | 206/524 |
| 4,193,499 | 3/1980 | Lookholder | 206/524 |
| 4,232,788 | 11/1980 | Roth | 206/524 |
| 4,267,927 | 5/1981 | English, Jr. | 206/328 |
| 4,865,197 | 9/1989 | Craig | 206/522 |
| 4,889,750 | 12/1989 | Wiley | 206/328 |

Primary Examiner—Jimmy G. Foster
Attorney, Agent, or Firm—David L. Davis

[57] ABSTRACT

Vibration and shock protection is provided for circuit cards by means of a sealed compliant bag which holds a supply of catalyst and resin which when mixed together form a foam which expands and becomes rigid upon curing. Initially, the catalyst and resin are maintained separated within the bag. Upon assembly, the catalyst and resin are mixed within the bag and the bag is placed within a housing. The circuit card is then installed in the housing. Formation and expansion of the foam causes the bag to conform to the top surface of the components mounted on the circuit card.

5 Claims, 3 Drawing Sheets

REMOVABLE RIGID SUPPORT STRUCTURE FOR CIRCUIT CARDS

BACKGROUND OF THE INVENTION

This invention relates to the provision of rigid protective support for circuit cards subjected to vibration and shock and, more particularly, to the provision of such protective support in a removable manner so that the circuit cards are repairable.

When electronic components are packaged for use in aerospace and missile systems, they must be protected from the high vibration and shock level environments to which they are subjected. In the past, protective measures have included housings mounted on isolators, encapsulation of the components in an insulating material (e.g., epoxy), and/or circuit cards with reinforcing ribs. These protective measures are disadvantageous in a number of ways. For example, disadvantages of isolators are cost, weight, sway space, and the space requirement of the isolators. A disadvantage of encapsulation is the difficulty in effecting repair. Disadvantages of ribs on circuit cards are cost, weight, and the use of valuable circuit card area. It is therefore a primary object of the present invention to provide shock and vibration protection for electronic components mounted on circuit cards without any of the disadvantages enumerated above.

SUMMARY OF THE INVENTION

The foregoing, and additional, objects are attained in accordance with the principles of this invention by providing suitable quantities of catalyst and resin in a sealed compliant bag, which materials, when mixed together, form a rigid foam. The circuit card to be protected is installed in a housing, the resin and catalyst are mixed together in the bag, and the bag is placed in the housing between a side of the circuit card and a wall of the housing. The mixed catalyst and resin form a foam which expands to fill the space between the circuit card and the housing wall and, after a sufficient time, the foam becomes rigid, thereby providing vibration and shock protection. To repair the circuit card, the rigid foam filled bag may be removed and replaced as a unit, after the repair has been effected.

BRIEF DESCRIPTION OF THE DRAWINGS

The foregoing will be more readily apparent upon reading the following description in conjunction with the drawings in which like elements in different figures thereof have the same reference numeral and wherein.

DETAILED DESCRIPTION

Figure 1:
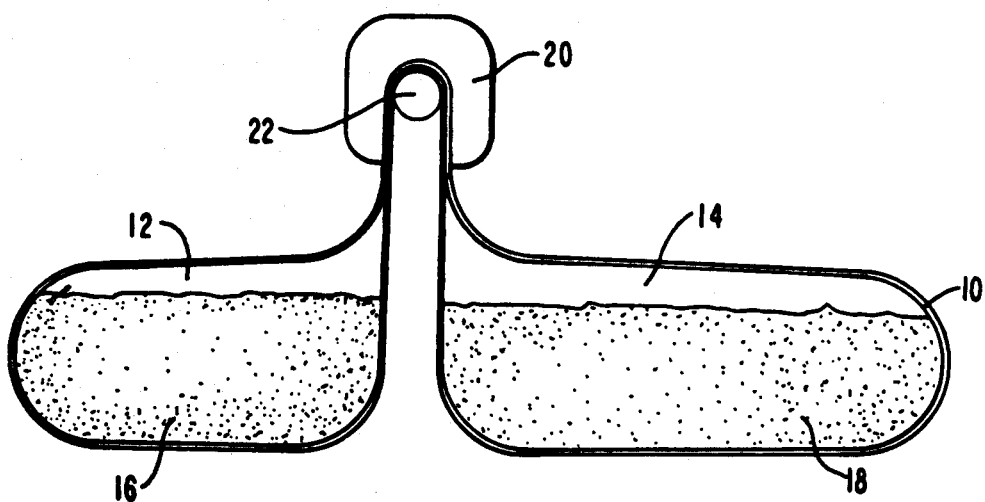
FIG. 1 illustrates a bag according to this invention filled with unmixed resin and catalyst.

According to this invention, there is provided a sealable compliant bag 10 which may be divided into a compartment 12 and a compartment 14. The compartment 12 is filled with a catalyst 16 and the compartment 14 is filled with a resin 18. The catalyst 16 and the resin 18 are of the types that when mixed together they form a foam which expands and becomes rigid upon curing. The curing may be effected over time either at room temperature or at an elevated temperature. An example of this type material is polyurethane ECCO foam FPH, available from Emerson and Cumings. Initially, the catalyst 16 and the resin 18 are kept separate by means of a clamp member 20 surrounding a pin 22 over which is draped an intermediate portion of the bag 20 between the compartment 12 and the compartment 14. So long as the catalyst 16 and the resin 18 are maintained separated, as shown in FIG. 1, no reaction therebetween takes place. However, if the clamp member 20 and the pin 22 are removed and the catalyst 16 and resin 18 are mixed within the bag 12, the result will be a foam which expands to assume whatever shape is allowed it by the bag 10.

A circuit card typically has electronic components mounted on one side thereof and solder connections to the components on the other side. As will be described hereinafter, according to this invention, the bag 10 is placed against the component side of the circuit card after the catalyst 16 and resin 18 are mixed but before the resultant foam hardens. Therefore, as the foam expands within the bag 10, which is against the component side of the circuit card, the resultant foam-filled bag will conform generally to the top surface of the components mounted on the circuit card. However, while generally conforming to the shape of the component, the bag will not wrap completely around the components and therefore it may be removed from contact with the circuit card by moving it away from the card in a direction substantially perpendicular to the plane of the card.

Figure 2:
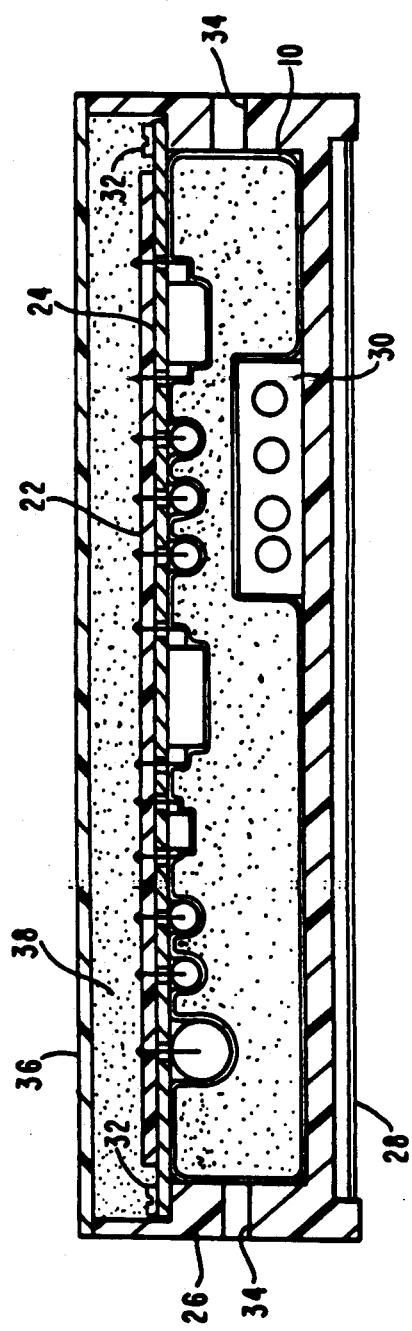
FIG. 2 illustrates a first embodiment of a circuit card protected in accordance with the principles of this invention.

FIG. 2 illustrates an embodiment of this invention wherein a circuit card 22 and an associated heat sink 24 are mounted in a housing 26 that supports an antenna 28 and associated radio frequency components 30. In accordance with this invention, the clamp member 20 is removed from the bag 10 and the catalyst 16 and the resin 18 are mixed together within the sealed bag 10. The bag 10 is then placed in bottom of the housing 26, over the components 30, and the circuit card 22 and associated heat sink 24 are mounted to the housing 26 by screws 32, with the component side of the circuit card 22 extending into the housing 26, toward the bag 10. Within a few minutes, activation of the mixed catalyst and resin causes the foam to form and expand. The amount of resin and catalyst is chosen based upon the volume within the housing 26 to be filled and the desired density of the foam. It is understood that the bag 10 is of appropriate size to fill that space within the housing 26. As the foam expands, the bag 10 is contoured around the components mounted on the circuit card 22, leaving a "U" shape around the leads and the components. Openings 34 allow air to escape from within the housing 26 as the bag 10 expands. If additional rigidity is required, the solder surface of the circuit card 22, as well as the interior of the cover member 36, can be sprayed with a mold release compound, such as Teflon, and the cavity 38 between the solder side of the circuit card 22 and the cover 36 can be filled with liquid foam before the cover 36 is installed.

In the event that repair to the circuit card 22 is necessary, the cover 36 is removed along with any foam in the cavity 38. The screws 32 are then removed and the assembly of the circuit card 22 and the heat sink 24 is lifted away from the bag 10, which is now rigid. If repairs do not change the outline of the components on the circuit card 22, the circuit card assembly can be reinstalled without changing the bag 10.

Figure 3:
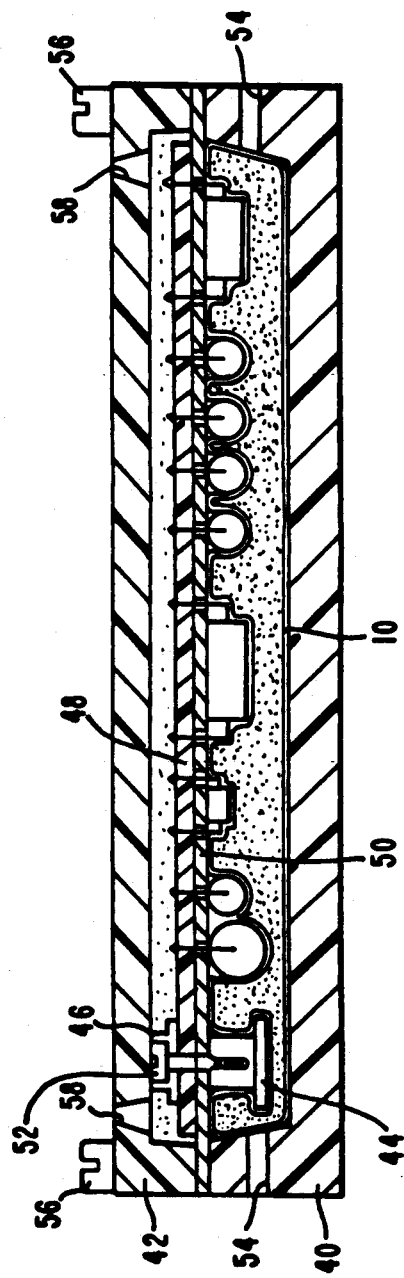
FIG. 3 illustrates a second embodiment of a circuit card protected in accordance with the principles of this invention.

FIG. 3 illustrates an embodiment for circuit cards that slide in tracks in a housing and plug into connectors. For this embodiment, there is provided a two part housing 40, 42 which is fabricated to the final maximum outline of the circuit card assembly. Anchoring inserts 44 and 46 are held to the circuit card 48 and the heat sink 50 by screws 52. In accordance with this invention, the clamp member 20 is removed from the bag 10 (FIG. 1) and the catalyst 16 and the resin 18 are mixed. The bag 10 is then placed in the housing part 40. The assembly of the circuit card 48 and the heat sink 50 is then placed over the housing part 40, with the component side of the circuit card extending toward the bag 10. Openings 54 allow air to escape as the bag 10 expands. A mold release material, such as Teflon, may then be sprayed over the solder side of the circuit card 48 and mixed foam-in-place liquid may be poured thereover. The housing part 42 is then clamped to the housing part 40 by screws 56 and openings 58 in the housing part 42 allow excess foaming material to escape.

As with the embodiment of FIG. 2, with the embodiment of FIG. 3 the circuit card may be repaired and replaced while the rigid foam support in the bag 10 remains intact.

Another advantage of the present invention is the improved thermal dissipation properties of the foam as compared to air.

Accordingly, there has been disclosed an improved manner of providing vibration and shock protection to circuit cards, which does not interfere with the repairability of the cards. While illustrative embodiments have been disclosed, it will be apparent to one of ordinary skill in the art that various modifications and adaptations to the disclosed embodiments can be made without departing from the spirit and scope of this invention, which is only intended to be limited by the appended claims.

I claim:

1. A method for adding structural rigidity during usage to a circuit card, comprising the steps of:
    providing a walled housing in which said circuit card is to be mounted;
    providing a sealable compliant bag;
    filling said bag with resin and catalyst which when mixed together form a foam which expands and becomes rigid upon curing;
    sealing said bag;
    fixedly mounting said circuit card to said housing;
    mixing said resin and catalyst in said bag;
    placing said bag in said housing between a side of said circuit card and a wall of said housing; and
    allowing the mixed resin and catalyst in said bag to cure.

2. The method according to claim 1 wherein the step of filling includes maintaining a separation within said bag of said resin from said catalyst.

3. The method according to claim 1 wherein the step of filling includes providing a sufficient amount of resin and catalyst that the resulting rigid foam substantially fills the space between said circuit card side and said housing wall so as to provide rigid support for said circuit card side.

4. An arrangement for rigidly supporting a circuit card within a housing during usage comprising:
    means for fixedly mounting said circuit card to said housing;
    a sealed compliant bag; and
    a quantity of resin and catalyst within said bag, said resin and catalyst being of the types that when mixed together form a foam which expands and becomes rigid upon curing;
    wherein said bag is supported within said housing between a side of said circuit card and a wall of said housing, the placement of said bag within said housing being effected after the resin and catalyst are mixed but before the resulting foam is cured.

5. The arrangement according to claim 4 wherein said housing includes means for allowing the evacuation of air from said housing upon expansion of said bag.

* * * * *